United States Patent
Ching et al.

(10) Patent No.: US 9,281,378 B2
(45) Date of Patent: Mar. 8, 2016

(54) FIN RECESS LAST PROCESS FOR FINFET FABRICATION

(71) Applicant: Taiwan Semiconductor Manufacturing Company, Ltd., Hsin-Chu (TW)

(72) Inventors: Kuo-Cheng Ching, Zhubei (TW); Shi Ning Ju, Hsin-Chu (TW); Guan-Lin Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/673,717

(22) Filed: Nov. 9, 2012

(65) Prior Publication Data
US 2014/0131776 A1     May 15, 2014

(51) Int. Cl.
*H01L 29/76*     (2006.01)
*H01L 29/66*     (2006.01)

(52) U.S. Cl.
CPC .... *H01L 29/66545* (2013.01); *H01L 29/66795* (2013.01)

(58) Field of Classification Search
CPC ............ H01L 29/66795; H01L 29/66545; H01L 21/76224; H01L 29/7834; H01L 27/10879
USPC ......... 257/392–331, 347, 302, 350, 351, 353, 257/E29.022; 438/149, 479, 517, 212, 268, 438/259, 270, 271, 589, 581, 588
See application file for complete search history.

(56) References Cited

U.S. PATENT DOCUMENTS

| | | |
|---|---|---|
| 6,720,619 B1 | 4/2004 | Chen et al. |
| 7,172,943 B2 | 2/2007 | Yeo et al. |
| 7,211,864 B2 | 5/2007 | Seliskar |
| 7,544,994 B2 | 6/2009 | Schepis et al. |
| 7,612,405 B2 | 11/2009 | Yu et al. |
| 7,622,773 B2 | 11/2009 | Irisawa et al. |
| 7,651,893 B2 | 1/2010 | Chen et al. |
| 7,714,384 B2 | 5/2010 | Seliskar |
| 7,728,324 B2 | 6/2010 | Tezuka et al. |
| 7,812,370 B2 * | 10/2010 | Bhuwalka et al. ............ 257/192 |
| 7,863,674 B2 | 1/2011 | Yeo et al. |
| 7,879,675 B2 | 2/2011 | Radosavljevic et al. |

(Continued)

FOREIGN PATENT DOCUMENTS

| CN | 101677085 | 3/2010 |
|---|---|---|
| KR | 1020110098594 | 9/2011 |

*Primary Examiner* — Cuong Q Nguyen
*Assistant Examiner* — Nishath Yasmeen
(74) *Attorney, Agent, or Firm* — Slater & Matsil, L.L.P.

(57) ABSTRACT

A method includes forming isolation regions extending from a top surface of a semiconductor substrate into the semiconductor substrate, and forming a hard mask strip over the isolation regions and a semiconductor strip. The semiconductor strip is between two neighboring ones of the isolation regions. A dummy gate strip is formed over the hard mask strip. A lengthwise direction of the dummy gate strip is perpendicular to a lengthwise direction of the semiconductor strip, and a portion of the dummy gate strip is aligned to a portion of the semiconductor strip. The method further includes removing the dummy gate strip, removing the hard mask strip, and recessing first portions of the isolation regions that are overlapped by the removed hard mask strip. A portion of the semiconductor strip between and contacting the removed first portions of the isolation regions forms a semiconductor fin.

20 Claims, 8 Drawing Sheets

(56) References Cited

U.S. PATENT DOCUMENTS

| | | |
|---|---|---|
| 7,915,112 B2 | 3/2011 | Xu et al. |
| 7,972,914 B2 * | 7/2011 | Kim et al. ............... 438/173 |
| 8,053,299 B2 | 11/2011 | Xu |
| 8,466,034 B2 | 6/2013 | Maszara et al. |
| 8,466,511 B2 * | 6/2013 | Oh et al. ............... 257/329 |
| RE44,431 E | 8/2013 | Pendse |
| 8,735,232 B2 | 5/2014 | Baars et al. |
| 2002/0003256 A1 | 1/2002 | Maegawa |
| 2002/0037619 A1 | 3/2002 | Sugihara et al. |
| 2002/0072197 A1 * | 6/2002 | Kang ............ H01L 21/823481 438/424 |
| 2005/0056888 A1 | 3/2005 | Youn et al. |
| 2005/0145932 A1 | 7/2005 | Park et al. |
| 2005/0224800 A1 | 10/2005 | Lindert et al. |
| 2005/0263795 A1 | 12/2005 | Choi et al. |
| 2007/0020879 A1 | 1/2007 | Baek et al. |
| 2007/0045736 A1 | 3/2007 | Yagishita |
| 2007/0063263 A1 | 3/2007 | Oh et al. |
| 2007/0102763 A1 | 5/2007 | Yeo et al. |
| 2007/0134884 A1 | 6/2007 | Kim et al. |
| 2007/0210355 A1 | 9/2007 | Izumida |
| 2007/0235819 A1 | 10/2007 | Yagishita |
| 2008/0157172 A1 | 7/2008 | Lee |
| 2008/0299734 A1 | 12/2008 | Lee et al. |
| 2009/0230483 A1 | 9/2009 | Mizumura et al. |
| 2009/0267155 A1 | 10/2009 | Izumida et al. |
| 2009/0315112 A1 | 12/2009 | Lee |
| 2010/0044784 A1 * | 2/2010 | Oh et al. ............... 257/329 |
| 2010/0052059 A1 | 3/2010 | Lee |
| 2010/0133614 A1 | 6/2010 | Beyer et al. |
| 2010/0163970 A1 | 7/2010 | Rakshit et al. |
| 2010/0207208 A1 | 8/2010 | Bedell et al. |
| 2010/0301391 A1 * | 12/2010 | Lochtefeld ....... H01L 29/66795 257/190 |
| 2011/0031552 A1 | 2/2011 | Iwamatsu et al. |
| 2011/0095378 A1 | 4/2011 | Lee et al. |
| 2011/0108930 A1 | 5/2011 | Cheng et al. |
| 2011/0147811 A1 | 6/2011 | Kavalieros et al. |
| 2011/0147828 A1 | 6/2011 | Murthy et al. |
| 2011/0147842 A1 | 6/2011 | Cappellani et al. |
| 2011/0171795 A1 | 7/2011 | Tsai et al. |
| 2011/0193178 A1 | 8/2011 | Chang et al. |
| 2011/0210404 A1 | 9/2011 | Su et al. |
| 2011/0215375 A1 | 9/2011 | Cook, Jr. et al. |
| 2011/0223736 A1 | 9/2011 | Lin et al. |
| 2011/0237046 A1 * | 9/2011 | Maszara ........... H01L 29/66795 438/424 |
| 2011/0291196 A1 | 12/2011 | Wei et al. |
| 2011/0316080 A1 | 12/2011 | Luo et al. |
| 2012/0074464 A1 | 3/2012 | Cea et al. |
| 2012/0091528 A1 | 4/2012 | Chang et al. |
| 2012/0091538 A1 | 4/2012 | Lin et al. |
| 2012/0104472 A1 | 5/2012 | Xu et al. |
| 2012/0161238 A1 | 6/2012 | Scheiper et al. |
| 2012/0168817 A1 | 7/2012 | Abou-Khalil et al. |
| 2012/0211807 A1 | 8/2012 | Yu et al. |
| 2012/0261726 A1 | 10/2012 | Yang et al. |
| 2012/0299100 A1 | 11/2012 | Ota et al. |
| 2012/0319211 A1 | 12/2012 | van Dal et al. |
| 2013/0049140 A1 | 2/2013 | Asenov et al. |
| 2013/0099282 A1 | 4/2013 | Chen et al. |
| 2013/0134506 A1 | 5/2013 | Yagishita |
| 2013/0175584 A1 | 7/2013 | Ho et al. |
| 2013/0181264 A1 | 7/2013 | Liao et al. |
| 2013/0187206 A1 | 7/2013 | Mor et al. |
| 2013/0200455 A1 | 8/2013 | Lo et al. |
| 2013/0270628 A1 | 10/2013 | Huang et al. |
| 2013/0285141 A1 | 10/2013 | Kuo et al. |

* cited by examiner

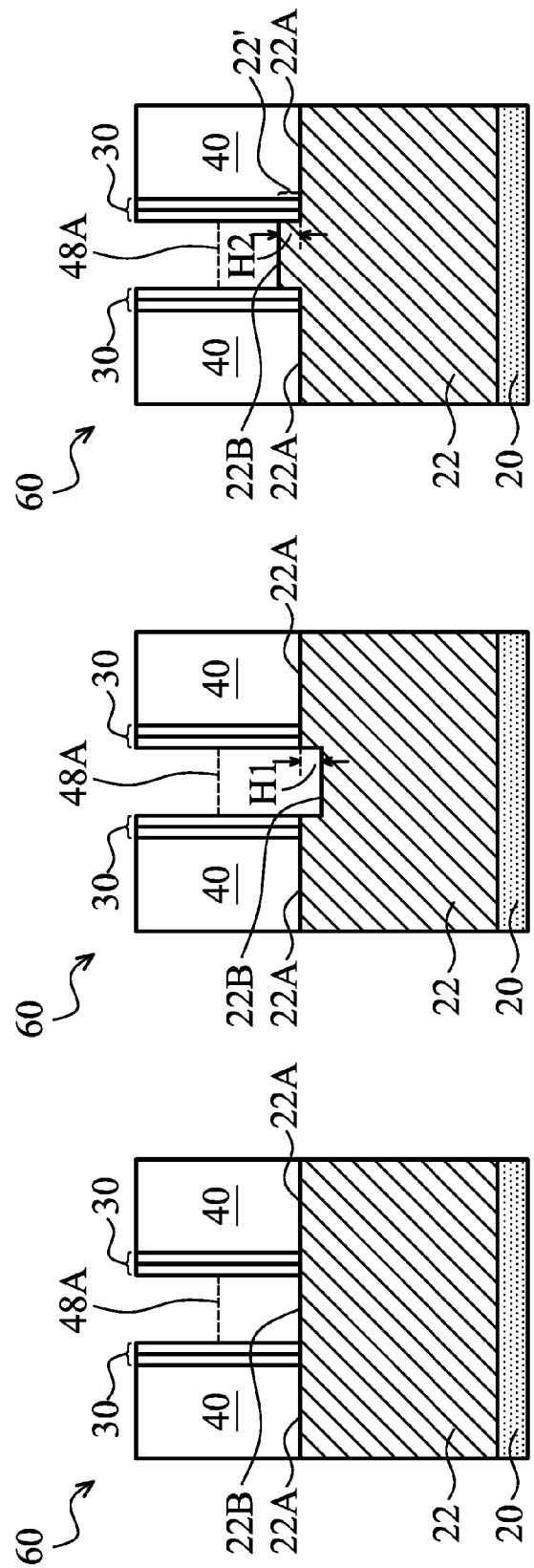

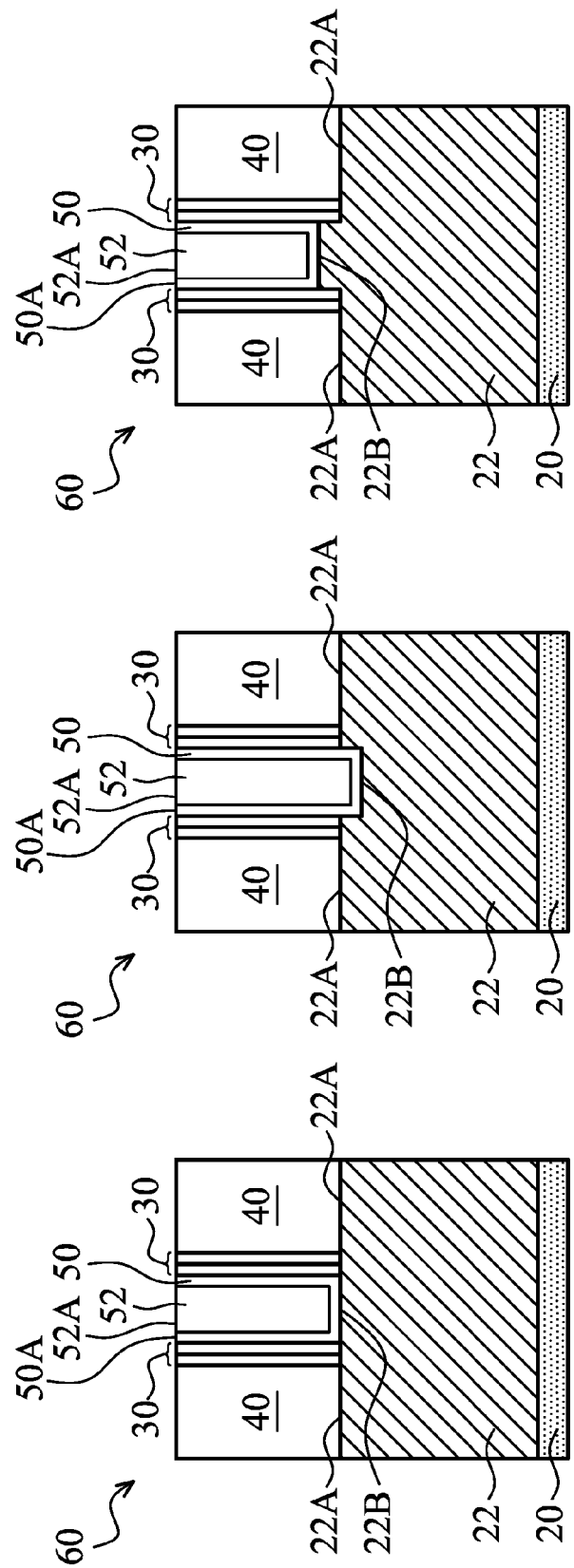

FIN RECESS LAST PROCESS FOR FINFET FABRICATION

CROSS-REFERENCE TO RELATED APPLICATION

This application relates to the following commonly-assigned U.S. patent application Ser. No. 13/356,769, filed Jan. 24, 2012, and entitled "FinFETs and Methods for Forming the Same," which application is hereby incorporated herein by reference.

BACKGROUND

With the increasing down-scaling of integrated circuits and increasingly demanding requirements to the speed of integrated circuits, transistors need to have higher drive currents with smaller dimensions. Fin Field-Effect Transistors (FinFETs) were thus developed. FinFETs have increased channel widths. The increase in the channel widths is achieved by forming channels that include portions on the sidewalls of semiconductor fins and portions on the top surfaces of the semiconductor fins. Since the drive currents of transistors are proportional to the channel widths, the drive currents of the FinFETs are increased.

In an existing FinFET formation process, Shallow Trench Isolation (STI) regions are first formed in a silicon substrate. The STI regions are then recessed to form silicon fins, which comprise portions of the silicon substrate that are over the recessed STI regions. Next, a gate dielectric, a gate electrode, and source and drain regions are formed to finish the formation of the FinFET.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Fin Field-Effect Transistor (FinFET) and the methods of forming the same are provided in accordance with various embodiments. The intermediate stages of forming the FinFET are illustrated. The variations of the embodiments are discussed. Throughout the various views and illustrative embodiments, like reference numbers are used to designate like elements.

Figure 1:
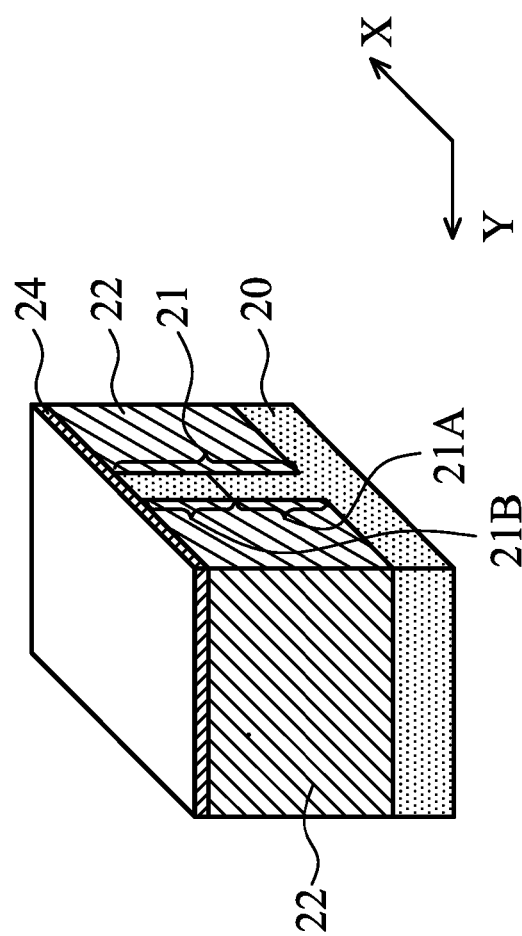
FIGS. 1 through 9D are perspective views and cross-sectional views of intermediate stages in the manufacturing of a FinFET in accordance with various exemplary embodiments.

FIGS. 1 through 9D are cross-sectional views and perspective views of intermediate stages in the manufacturing of a FinFET in accordance with some exemplary embodiments. FIG. 1 illustrates a perspective view of an initial structure. The initial structure includes substrate 20. Substrate 20 may be a semiconductor substrate, which may further be a silicon substrate, a germanium substrate, or a substrate formed of other semiconductor materials. Substrate 20 may be doped with a p-type or an n-type impurity. Isolation regions such as Shallow Trench Isolation (STI) regions 22 are formed in substrate 20 and extend from a top surface of substrate 20 into substrate 20.

Figure 3:
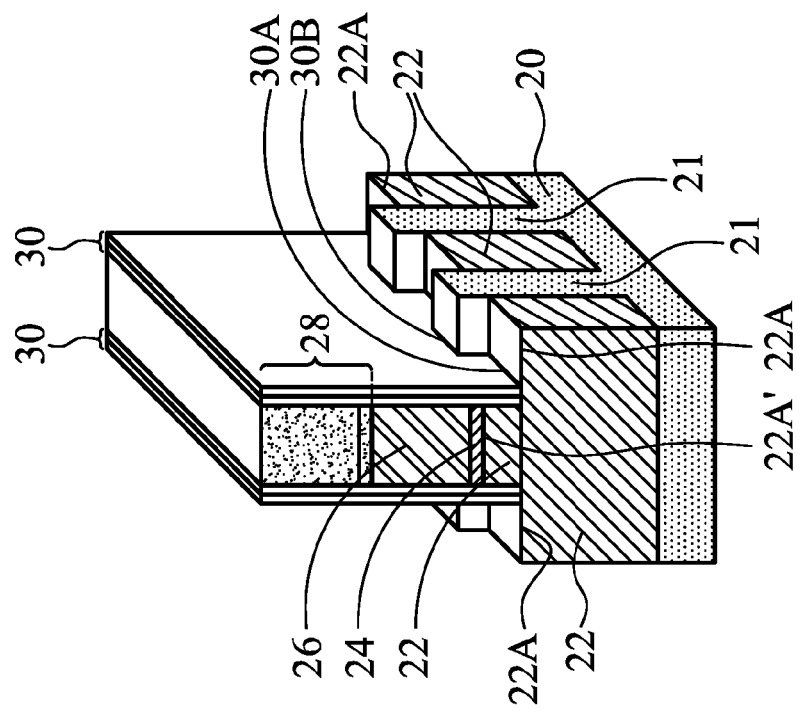

As shown in FIG. 1, semiconductor strip 21 is formed between, and contacting, neighboring STI regions 22. The longitudinal direction of semiconductor strip 21 is in the Y direction. Although one semiconductor strip 21 is shown in FIG. 1 for clarity, there may be a plurality of semiconductor strips 21 parallel to each other, as also illustrated in FIG. 3. In some exemplary embodiments, the material of semiconductor strip 21 is the same as the material of substrate 20, which may be silicon, for example. In alternative embodiments, the material of semiconductor strip 21 is different from the material of substrate 20. In some exemplary embodiments, the FinFET that is to be formed is a p-type FinFET, and semiconductor strip 21 includes relaxed silicon germanium (SiGe) region 21A and substantially pure germanium region 21B over relaxed SiGe region 21A. In alternative exemplary embodiments, the FinFET that is to be formed is an n-type MOSFET, and semiconductor strip 21 includes relaxed silicon germanium (SiGe) region 21A and substantially pure silicon region 21B over relaxed SiGe region 21A. In these embodiments, semiconductor strip 21 may be formed by etching a portion of the original substrate 20 between STI regions 22, and epitaxially growing semiconductor strip 21 between STI regions 22.

Hard mask layer 24 is formed over semiconductor strip 21 and STI regions 22. Hard mask layer 24 may be in contact with the top surfaces of STI regions 22 and semiconductor strip 21. In some embodiments, hard mask layer 24 comprises silicon nitride. In alternative embodiments, materials such as silicon oxide, silicon carbide, metal nitrides such as titanium nitride and tantalum nitride, or the like, may also be used.

Figure 2:
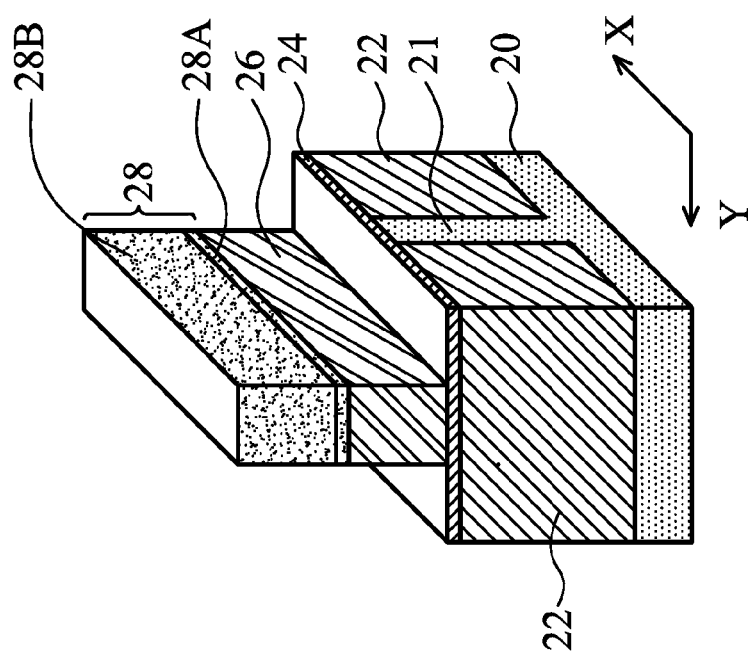

Referring to FIG. 2, polysilicon layer 26 is deposited. In accordance with some embodiments, a planarization step such as a grinding or a Chemical Mechanical Polish (CMP) is performed to level the top surface of polysilicon layer 26. Hard mask layer 28 is then formed over polysilicon layer 26. Hard mask layer 28 may be formed of silicon nitride, for example, although other materials such as silicon oxide may also be used. In some exemplary embodiments, as shown in FIG. 2, hard mask layer 28 includes silicon nitride layer 28A and oxide layer 28B over silicon nitride layer 28A.

As also shown in FIG. 2, hard mask layer 28 is patterned. To pattern hard mask layer 28, a photo resist (not shown) may be formed and patterned first, and the patterned photo resist is used as an etching mask to pattern hard mask layer 28. The patterned photo resist is then removed. A remaining portion of hard mask layer 28 is referred to as hard mask strip 28 hereinafter. Next, hard mask strip 28 is used as an etching mask to etch the underlying polysilicon layer 26, wherein the patterning may be stopped on hard mask layer 24. A remaining portion of polysilicon layer 26 is referred to as polysilicon strip 26 hereinafter. Polysilicon strip 26 overlaps a middle portion of semiconductor strip 21, and having a longitudinal direction in X direction, which is perpendicular to the Y direction.

Figure 6:
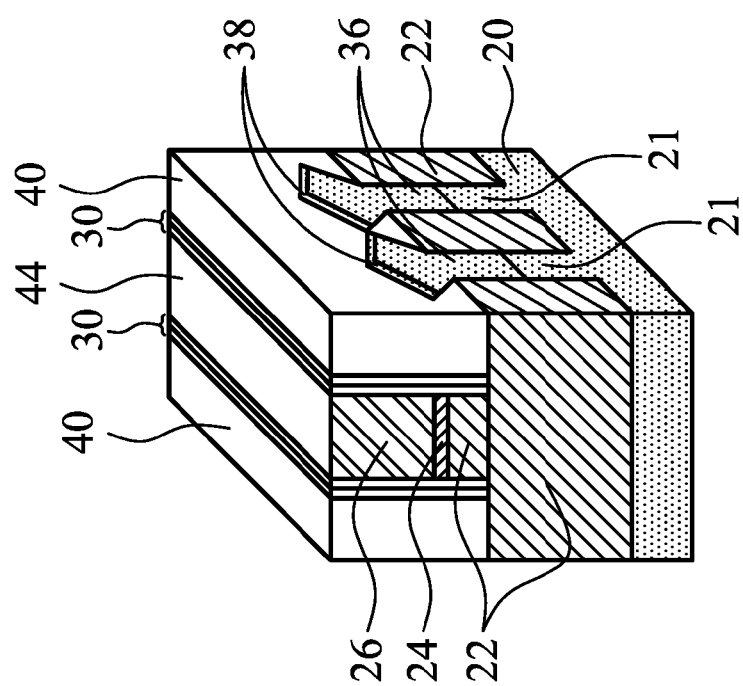

Referring to FIG. 3, hard mask strip 28 is used as an etching mask to selectively pattern hard mask layer 24. In FIG. 3, two semiconductor strips 21 are illustrated. Some portions of STI regions 22 and semiconductor strips 21 are exposed as a result of the patterning of hard mask layer 24. A first STI recessing may be performed after the patterning of hard mask layer 24. As a result of the STI recessing, top surfaces 22A of STI regions 22 are also recessed from the original top surface 22A' of STI regions. In some embodiments, the exposed portions of semiconductor strips 21 that are not covered by hard mask strip 28 are not recessed. In some embodiments, after the patterning of hard mask layer 24, and before or after the recessing of STI regions 22, hard mask strip 28 is removed. In alternative embodiments, hard mask strip 28 may be removed after some subsequent steps are performed. For example, hard mask strip 28 may be performed after the formation of Inter-Layer Dielectric (ILD) 40 (FIG. 6).

Next, as also shown in FIG. 3, gate spacers 30 are formed on the sidewalls of hard mask strip 28, polysilicon strip 26, and the sidewalls of some un-recessed portions of STI regions 22. Gate spacers 30 are formed of dielectric materials. Gate spacers 30 comprise first bottom surfaces 30A landing on the top surfaces 22A of STI regions 22, and second top surfaces 30B landing on the top surfaces of semiconductor strips 21. Since top surfaces 22A of the recessed STI regions 22 are lower than the top surfaces of semiconductor strips 21, first bottom surfaces 30A are lower than the second bottom surfaces 30B.

Figure 4:
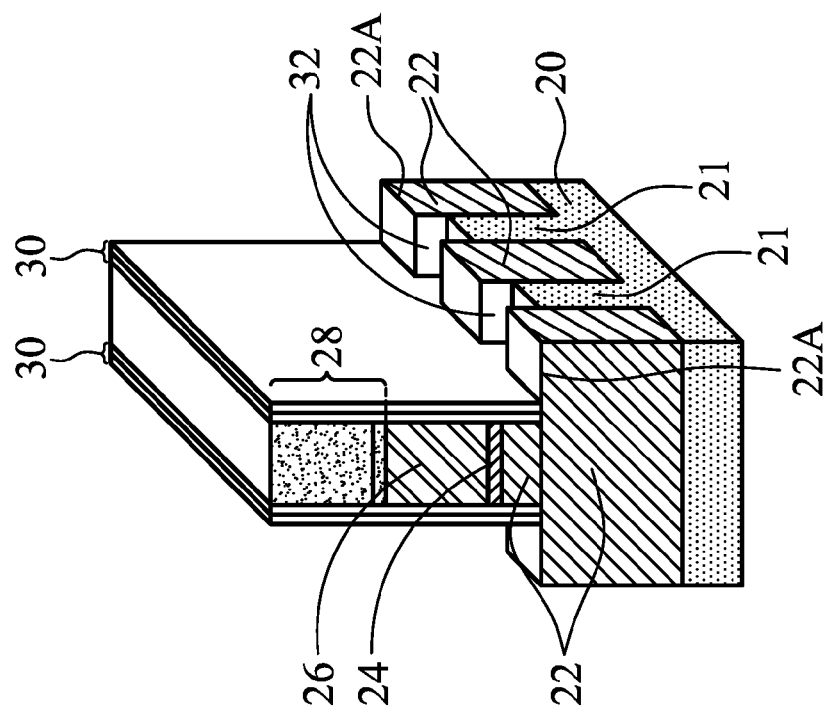

Referring to FIG. 4, after the formation of gate spacers 30, exposed portions of semiconductor strip 21 are recessed, for example, using anisotropic etching. In some embodiments, portions of semiconductor strips 21 above the exposed top surface 22A of STI regions 22 are etched. The etching of semiconductor strips 21 may be continued until the top surfaces of semiconductor strips 21 are lower the top surfaces 22A of STI regions 22, forming recesses 32 in STI regions 22. Recesses 32 include portions that on opposite sides of polysilicon strip 26.

Figure 5:
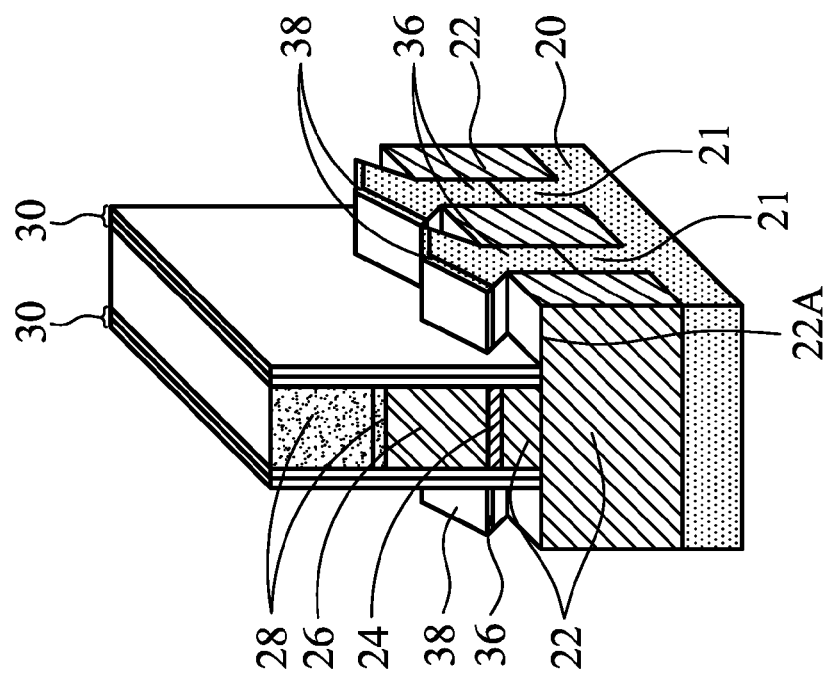

Next, as shown in FIG. 5, epitaxy regions 36 are formed by selectively growing epitaxy regions 36 from recesses 32 (FIG. 4). In some exemplary embodiments, epitaxy regions 36 comprise silicon germanium or silicon carbon. Alternatively, epitaxy regions 36 are formed of silicon. After recesses 32 are filled with epitaxy regions 36, the further epitaxial growth of epitaxy regions 36 causes epitaxy regions 36 to expand horizontally, and facets start to form. Furthermore, some of top surfaces 22A of STI regions 22 are underlying some portions of epitaxy regions 36 due to the horizontal growth of epitaxy regions 36. After the epitaxy step, epitaxy regions 36 may be implanted to form source and drain regions, which are also denoted using reference numeral 36. Source and drain regions 36 are on opposite sides of polysilicon strip 26, and may be overlying and overlapping portions of surfaces 22A of STI regions 22. Following the formation of source and drain regions 36, source and drain silicide regions 38 may be formed by siliciding the top portions of epitaxy regions 36. In alternative embodiments, source and drain silicide regions 38 are formed after the formation of replacement gate electrode 52 (FIGS. 9A-9D).

FIG. 6 illustrates the formation of Inter-Layer Dielectric (ILD) 40. In some embodiments, ILD 40 includes carbon-containing oxides, silicate glass, or other dielectric materials. ILD 40 may be filled until its top surface is higher than the top surface of polysilicon strip 26, or higher than hard mask strip 28 (not shown in FIG. 6, please refer to FIGS. 3 and 4). A CMP is then performed to remove excess ILD 40. In some embodiments, polysilicon strip 26 is used as a CMP stop layer, so that the top surfaces of ILD 40 is level with the top surfaces of polysilicon strips 26. In alternative embodiments, hard mask strip 28 (FIG. 3) may also be used as a CMP stop layer. In the embodiments wherein hard mask strip 28 is used as the CMP stop layer, after the CMP, an etching step may be performed to remove hard mask strip 28.

Figure 7:
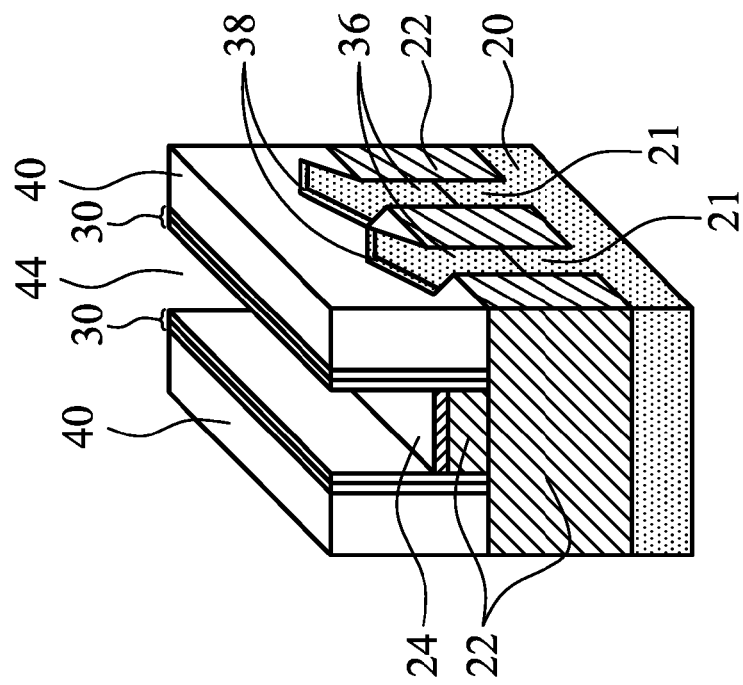

Next, referring to FIG. 7, polysilicon strip 26 is removed in an etching step, so that recess 44 is formed between opposite gate spacers 30. Hard mask layer 24 is thus exposed. Since polysilicon strip 26 is not in the final structure, polysilicon strip 26 is referred to as a dummy polysilicon strip throughout the description.

After the removal of dummy polysilicon strip 26, hard mask layer 24 is removed. The resulting structure is shown in FIG. 8A. After the removal of hard mask layer 24, the portions of STI regions 22 underlying the removed hard mask layer 24 are recessed in a second recessing step, which may be a selective etching step, so that recess 44 extends downwardly. The top surfaces the recessed STI regions 22 are also recessed from the original surfaces 22A' (FIG. 3) to top surfaces 22B. As a result, STI regions 22 have top surfaces 22B generated by the etching step. During the selective etching, semiconductor strips 21 are not etched, and the portions of semiconductor strips 21 over top surface 22B form semiconductor fins 48.

Figure 8B:
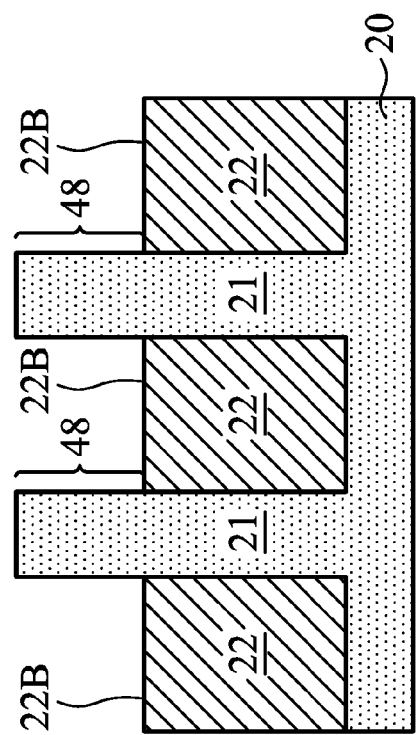
Figure 8A:
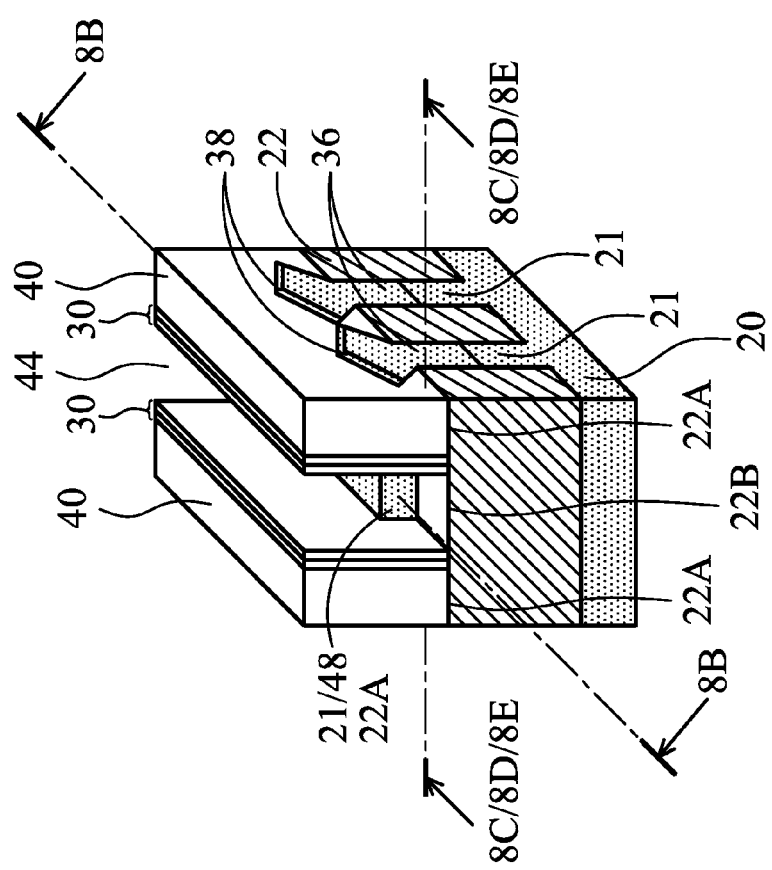

FIG. 8B illustrates a cross-sectional view of the structure in FIG. 8A, wherein the cross-sectional view is obtained from the plane crossing line 8B-8B in FIG. 8A. Semiconductor fins 48 are illustrated in FIG. 8B.

FIGS. 8C, 8D, and 8E illustrate cross-sectional views of the structure in FIG. 8A in accordance various embodiments, wherein the cross-sectional views are obtained from the plane crossing line 8C/8D/8E-8C/8D/8E in FIG. 8A. In some embodiments, as illustrated in FIGS. 8C and 8A, top surfaces 22B are level with top surfaces 22A of STI regions 22. In alternative embodiments, as shown in FIG. 8D, top surfaces 22B are lower than top surfaces 22A of STI regions 22. In yet alternative embodiments, as shown in FIG. 8E, top surfaces 22B are higher than top surfaces 22A of STI regions 22. In FIG. 8E, portions 22' of STI regions 22 are located between opposite gate spacers 30, and the sidewalls of portions 22' are in contact with the sidewalls of gate spacers 30. Top surfaces 48A of semiconductor fins 48 are illustrated using a dashed line in FIGS. 8C, 8D, and 8E since semiconductor fin 48 is not in the planes illustrated in FIGS. 8C, 8D, and 8E.

Figure 9A:
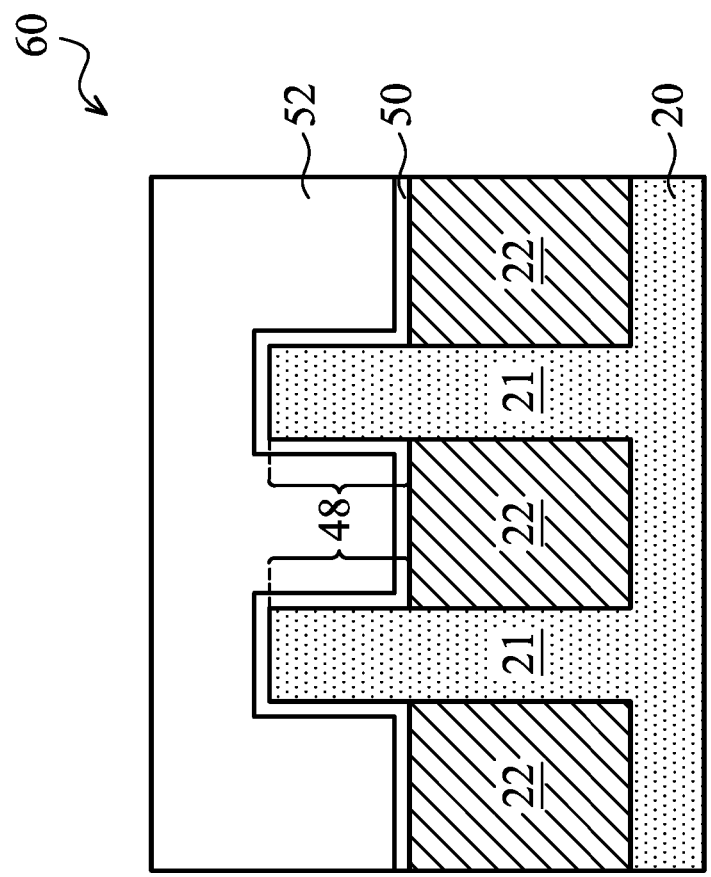

FIGS. 9A and 9B illustrate the formation of gate dielectric layer 50 and gate electrode 52. The cross-sectional view in FIG. 9A is obtained from the same plane that crosses lines 8B-8B in FIG. 8A. First, gate dielectric layer 50 is formed in recess 44 (FIG. 8A) and on the top surfaces and the sidewalls of semiconductor fins 48. In accordance with some embodiments, gate dielectric layer 50 comprises silicon oxide, silicon nitride, or multilayers thereof. In alternative embodiments, gate dielectric layer 50 comprises a high-k dielectric material, and hence is alternatively referred to as high-k gate dielectric layer 50 throughout the description. High-k gate dielectric layer 50 may have a k value greater than about 7.0, and may include a metal oxide or a silicate of Hf, Al, Zr, La, Mg, Ba, Ti, Pb, and combinations thereof. The formation methods of gate dielectric layer 50 may include Molecular-Beam Deposition (MBD), Atomic Layer Deposition (ALD), Physical Vapor Deposition (PVD), and the like.

Next, conductive material 52 is formed over gate dielectric layer 50, and fills the remaining recess 44 (FIG. 8A). Conductive material 52 may comprise a metal-containing material such as TiN, TaN, TaC, Co, Ru, Al, combinations thereof, and multi-layers thereof. The work function of conductive material 52 may be, or may not be, a band-edge work function, depending on whether the respective FinFET is a p-type FinFET or an n-type FinFET. After the filling of conductive material 52, a CMP may be performed to remove the excess portions of gate dielectric layer 50 and conductive material 52 over the top surface of ILD 40. The resulting remaining portions of the conductive material and gate dielectric layer 50 thus form the replacement gate, which includes gate electrode 52 and gate dielectric 50, respectively, of the resulting FinFET 60.

The cross-sectional views in FIGS. 9B, 9C, and 9D are obtained in accordance with various embodiments, and are obtained from the same plane that crosses line 8C/8D/8E-8C/8D/8E in FIG. 8A. Furthermore, FinFETs 60 in FIGS. 9B, 9C, and 9D are obtained from the structures in FIGS. 8C, 8D, and 8E, respectively. Referring to FIGS. 9B, 9C, and 9D, due to the replacement-gate formation process, top edge 50A of gate dielectric 50 is level with top edge 52A of gate electrode 52. In subsequent process steps, an additional ILD (not shown) may be formed over ILD 40, and contact plugs (not shown) may be formed to penetrate through the additional ILD and the underlying ILD 40 to electrically couple to gate electrode 52 and silicide regions 38 (FIG. 6). The formation of FinFET 60 is thus finished.

The FinFETs 60 in accordance with embodiments have replacement gates. By recessing STI regions to form semiconductor fins after the formation of source and drain regions, there is no need to form dummy oxides to cover the fins of core FinFETs when Input/output (IO) devices are formed. The profile of the semiconductor fins are thus not prone to the damage caused by the formation and the removal of the dummy oxides.

It is observed that in the resulting FinFET 60, the portions of STI regions 22 that are on the opposite sides of a same gate electrode 52 (FIGS. 9B, 9C, and 9D) have top surfaces 22A that are either higher than, level with, or lower than, top surface 22B that are underlying (and aligned to) gate electrode 52. This is different from the conventional FinFETs. In the conventional FinFETs, the STI regions 22 that are on the opposite sides of a gate electrode have top surfaces that are level with the top surface of the portion of the STI region that is underlying (and aligned to) the gate electrode.

In accordance with embodiments, a method includes forming isolation regions extending from a top surface of a semiconductor substrate into the semiconductor substrate, and forming a hard mask strip over the isolation regions and a semiconductor strip, wherein the semiconductor strip is between two neighboring ones of the isolation regions. A dummy gate strip is formed over the hard mask strip, wherein a lengthwise direction of the dummy gate strip is perpendicular to a lengthwise direction of the semiconductor strip, and wherein a portion of the dummy gate strip is aligned to a portion of the semiconductor strip. The method further includes removing the dummy gate strip, removing the hard mask strip, and recessing first portions of the isolation regions that are overlapped by the removed hard mask strip. A portion of the semiconductor strip between and contacting the removed first portions of the isolation regions forms a semiconductor fin.

In accordance with other embodiments, a method includes forming a hard mask layer over isolation regions and a semiconductor strip, wherein the isolation regions extend from a top surface of a semiconductor substrate into the semiconductor substrate, and wherein the semiconductor strip is between the isolation regions. The method further includes forming a hard mask strip over the isolation regions and the semiconductor strip, forming a dummy gate strip over the hard mask strip, and performing a first recessing to recess first portions of the isolation regions, wherein the first recessing has a first recessing depth. The first portions of the isolation regions are on opposite sides of the dummy gate strip. After the first recessing, the dummy gate strip is removed, and the hard mask strip is removed. A second recessing is performed to recess second portions of the isolation regions that are overlapped by the removed dummy gate strip. The second recessing has a second recessing depth, wherein a portion of the semiconductor strip between and contacting the second portions of the isolation regions forms a semiconductor fin.

In accordance with yet other embodiments, a FinFET includes a semiconductor fin, a gate dielectric on sidewalls of the semiconductor fin, a gate electrode over the gate dielectric, wherein the gate dielectric and the gate electrode form a replacement gate, and gate spacers on opposite sides of the gate dielectric and the gate electrode. The gate dielectric includes a portion between and contacting the gate electrode and one of the gate spacers.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming isolation regions extending from a top surface of a semiconductor substrate into the semiconductor substrate;
        forming a hard mask strip layer over and contacting the isolation regions and a semiconductor strip, wherein the semiconductor strip is between two neighboring ones of the isolation regions;
    forming a dummy gate strip layer over the hard mask strip layer;
    patterning the hard mask strip layer and the dummy gate strip layer using a same etching mask to form a hard mask strip and a dummy gate strip, respectively;
    recessing second portions of the isolation regions un-covered by the dummy gate strip;
    forming a gate spacer on a sidewall of the dummy gate strip, wherein an edge of the gate spacer is in physical contact with an edge of the isolation regions, wherein the gate spacer extends below a top surface of the semiconductor strip;
    removing the dummy gate strip;
    removing the hard mask strip; and
    recessing first portions of the isolation regions that are overlapped by the removed hard mask strip, wherein a portion of the semiconductor strip between and contacting the recessed first portions of the isolation regions forms a semiconductor fin.

2. The method of claim 1 further comprising:
    before the step of recessing the first portions of the isolation regions, forming source and drain regions on opposite sides of the dummy gate strip; and
    forming an Inter-Layer Dielectric (ILD) on opposite sides of the dummy gate strip and over the source and drain regions, wherein lower portions of the source and drain regions are separated from each other by the isolation regions.

3. The method of claim 2, wherein the step of forming the source and drain regions comprises:
   recessing portions of the semiconductor strip, wherein in the recessing the portions of the semiconductor strip, a portion of the isolation regions in contact with the recessed portions of the semiconductor strip is not recessed; and
   performing an epitaxy to grow the source and drain regions in recesses formed by the step of recessing the portions of the semiconductor strip.

4. The method of claim 1 further comprising:
   before forming the hard mask strip, recessing a semiconductor material between the neighboring ones of the isolation regions; and
   performing an epitaxy to grow the semiconductor strip between the neighboring ones of the isolation regions.

5. The method of claim 1 further comprising:
   forming a gate dielectric on sidewalls and a top surface of the semiconductor fin; and
   forming a gate electrode over the gate dielectric.

6. A method comprising:
   forming a hard mask layer over isolation regions and a semiconductor strip, wherein the isolation regions extend from a top surface of a semiconductor substrate into the semiconductor substrate, and wherein the semiconductor strip is between the isolation regions;
   forming a hard mask strip over the isolation regions and the semiconductor strip;
   forming a dummy gate strip over the hard mask strip;
   performing a first recessing to recess first portions of the isolation regions, wherein the first recessing has a first recessing depth, and wherein the first portions of the isolation regions are on opposite sides of the dummy gate strip;
   forming gate spacers on opposite sidewalls of the dummy gate strip, wherein the gate spacers are in contact with sidewalls of second portions of the isolation regions;
   after the first recessing, removing the dummy gate strip;
   removing the hard mask strip; and
   performing a second recessing to recess the second portions of the isolation regions that are overlapped by the removed dummy gate strip, wherein the second recessing has a second recessing depth, wherein the first recessing and the second recessing are configured to make the first recessing depth greater than, smaller than, or substantially equal to, the second recessing depth, and wherein a portion of the semiconductor strip between and contacting the second portions of the isolation regions forms a semiconductor fin.

7. The method of claim 6 further comprising:
   forming source and drain regions on opposite sides of the dummy gate strip.

8. The method of claim 7, wherein the gate spacers are further on sidewalls of the hard mask strip.

9. The method of claim 7 further comprising, after the step of forming the source and drain regions, forming an Inter-Layer Dielectric (ILD) on opposite sides of the gate spacers and over the source and drain regions.

10. The method of claim 6 further comprising:
    forming a gate dielectric on sidewalls and a top surface of the semiconductor fin; and
    forming a gate electrode over the gate dielectric.

11. A method comprising:
    forming isolation regions extending from a top surface of a semiconductor substrate into the semiconductor substrate, wherein a portion of the semiconductor substrate between neighboring ones of the isolation regions forms a semiconductor strip;
    forming a hard mask strip layer over and contacting the isolation regions and the semiconductor strip;
    forming a dummy gate strip layer over the hard mask strip layer;
    patterning the hard mask strip layer and the dummy gate strip layer using a same etching mask to form a hard mask strip and a dummy gate strip, respectively;
    using the same etching mask to recess portions of the isolation regions not covered by the same etching mask;
    forming a gate spacer contacting sidewalls of the hard mask strip and the dummy gate strip, wherein the gate spacer is further in contact with an edge of a portion of the isolation region overlapped by the dummy gate strip;
    forming a source/drain region overlapping a bottom portion of the semiconductor strip;
    forming an Inter-Level Dielectric (ILD) over the source/drain region;
    after forming the ILD, performing a first recessing to recess portions of the isolation regions, wherein a top portion of a middle portion of the semiconductor strip forms a semiconductor fin protruding above surfaces of recessed isolation regions; and
    forming a gate stack on a top surface and sidewalls of the semiconductor fin.

12. The method of claim 11, wherein a lengthwise direction of the dummy gate strip is perpendicular to a lengthwise direction of the semiconductor strip, and the method further comprises
    after the forming the ILD and before the first recessing, removing the dummy gate strip to form a recess in the ILD, wherein the first recessing is performed through the recess.

13. The method of claim 11, wherein the forming the source/drain region comprises:
    performing a second recessing to recess portions of the isolation regions on opposite sides of an end portion of the semiconductor strip; and
    performing an epitaxy to grow the source/drain region from a space left by the second recessing.

14. The method of claim 13, wherein during the second recessing, portions of the isolation regions on opposite sides of the middle portion of the semiconductor strip is not recessed.

15. The method of claim 13, wherein the forming the gate spacer is performed before the first recessing and the second recessing.

16. The method of claim 11, wherein the forming the gate stack comprises:
    forming a gate dielectric layer on the top surface and the sidewalls of the semiconductor fin;
    forming a conductive material over the gate dielectric layer; and
    performing a Chemical Mechanical Polish (CMP) to form a gate dielectric and a gate electrode from the gate dielectric layer and the conductive material, respectively, wherein portions of the gate dielectric layer and the conductive material over the ILD are removed during the CMP.

17. The method of claim 5, wherein the gate dielectric and the gate electrode occupy a space left by the removed hard mask strip and the removed dummy gate strip.

18. The method of claim 6, wherein the forming the hard mask strip and the forming the dummy gate strip comprise:
  forming a hard mask strip layer comprising a bottom surface contacting a top surface of the semiconductor strip;
  forming a dummy gate strip layer; and
  patterning the hard mask strip layer and the dummy gate strip layer using a same etching mask to form the hard mask strip and the dummy gate strip, respectively.

19. The method of claim 10, wherein the gate dielectric and the gate electrode occupy a space left by the removed hard mask strip and the dummy gate strip.

20. The method of claim 12, wherein after the removing the dummy gate strip, the semiconductor fin does not have any portion overlapped by any remaining portion of the dummy gate strip.

* * * * *